(12) United States Patent
Liao

(10) Patent No.: US 10,461,165 B2
(45) Date of Patent: Oct. 29, 2019

(54) SEMICONDUCTOR DEVICE AND METHOD OF FORMATION

(71) Applicants: TAIWAN SEMICONDUCTOR MANUFACTURING COMPANY LIMITED, Hsin-Chu (TW); NATIONAL TAIWAN UNIVERSITY, Taipei (TW)

(72) Inventor: Ming-Han Liao, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 29 days.

(21) Appl. No.: 15/906,226

(22) Filed: Feb. 27, 2018

(65) Prior Publication Data
US 2018/0190783 A1 Jul. 5, 2018

Related U.S. Application Data

(62) Division of application No. 14/321,983, filed on Jul. 2, 2014, now Pat. No. 9,917,169.

(51) Int. Cl.
*H01L 29/423* (2006.01)
*H01L 29/786* (2006.01)
*H01L 29/66* (2006.01)

(52) U.S. Cl.
CPC .. *H01L 29/42392* (2013.01); *H01L 29/66742* (2013.01); *H01L 29/78696* (2013.01)

(58) Field of Classification Search
CPC ......... H01L 29/42392; H01L 29/66742; H01L 29/78696
See application file for complete search history.

(56) References Cited

U.S. PATENT DOCUMENTS

| 7,615,429 | B2 | 11/2009 | Kim et al. |
| 2005/0059194 | A1* | 3/2005 | Lee .................. H01L 29/42384 |
| | | | 438/157 |
| 2008/0135949 | A1* | 6/2008 | Lo .......................... B82Y 10/00 |
| | | | 257/401 |

(Continued)

FOREIGN PATENT DOCUMENTS

| CN | 101740619 A | 6/2010 |
| CN | 1487599 A | 4/2014 |

OTHER PUBLICATIONS

Kuhn, et al., "The Ultimate CMOS Device and Beyond", Electron Devices Meeting (IEDM), 2012 IEEE International, Dec. 10-13, 2012, pp. 1-4.

(Continued)

*Primary Examiner* — Vongsavanh Sengdara
(74) *Attorney, Agent, or Firm* — Slater Matsil, LLP

(57) ABSTRACT

A semiconductor device and method of formation are provided. The semiconductor device includes a channel surrounding a dielectric tube and a gate surrounding the channel. The dielectric tube comprises a high dielectric constant material that has or conducts few to no carriers, such as electrons or holes. The presence of the dielectric tube confines carriers to the channel, which is in close proximity to the gate. The proximity of the channel, and the carriers therein, to the gate affords greater control to the gate over the carriers, thus allowing a length of the channel to be decreased while experiencing little to no short channel effects, such as current leakage through the channel.

20 Claims, 11 Drawing Sheets

(56) References Cited

U.S. PATENT DOCUMENTS

| | | | |
|---|---|---|---|
| 2011/0062417 A1* | 3/2011 | Iwayama | B82Y 10/00 257/24 |
| 2011/0133169 A1* | 6/2011 | Bangsaruntip | B82Y 10/00 257/38 |
| 2011/0278539 A1* | 11/2011 | Bangsaruntip | B82Y 10/00 257/14 |
| 2011/0278544 A1* | 11/2011 | Bangsaruntip | B82Y 10/00 257/24 |
| 2014/0034908 A1* | 2/2014 | Bangsaruntip | H01L 29/775 257/27 |
| 2014/0091279 A1* | 4/2014 | Kachian | B82Y 10/00 257/27 |
| 2014/0131660 A1* | 5/2014 | Cea | H01L 29/42392 257/24 |
| 2014/0183452 A1* | 7/2014 | Hirai | H01L 29/778 257/24 |
| 2014/0225065 A1* | 8/2014 | Rachmady | H01L 29/42392 257/24 |
| 2014/0264253 A1* | 9/2014 | Kim | H01L 29/0673 257/9 |
| 2014/0264280 A1* | 9/2014 | Kim | H01L 29/785 257/29 |
| 2015/0295084 A1* | 10/2015 | Obradovic | H01L 29/7845 257/347 |
| 2016/0211322 A1* | 7/2016 | Kim | H01L 29/66795 |

OTHER PUBLICATIONS

Kuhn, Kelin J., "Considerations for Ultimate CMOS Scaling", IEEE Transactions on Electron Devices, vol. 59, No. 7, Jul. 2012, http://ieeexplore.ieee.org/cart/download.jsp?partnum=6200837&searchProductType=IEEP%20Journals%20Transactions, pp. 1813-1828.

* cited by examiner

SEMICONDUCTOR DEVICE AND METHOD OF FORMATION

RELATED APPLICATIONS

This application is a divisional of and claims priority to U.S. patent application Ser. No. 14/321,983, titled "SEMICONDUCTOR DEVICE AND METHOD OF FORMATION" and filed on Jul. 2, 2014, which is incorporated herein by reference.

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
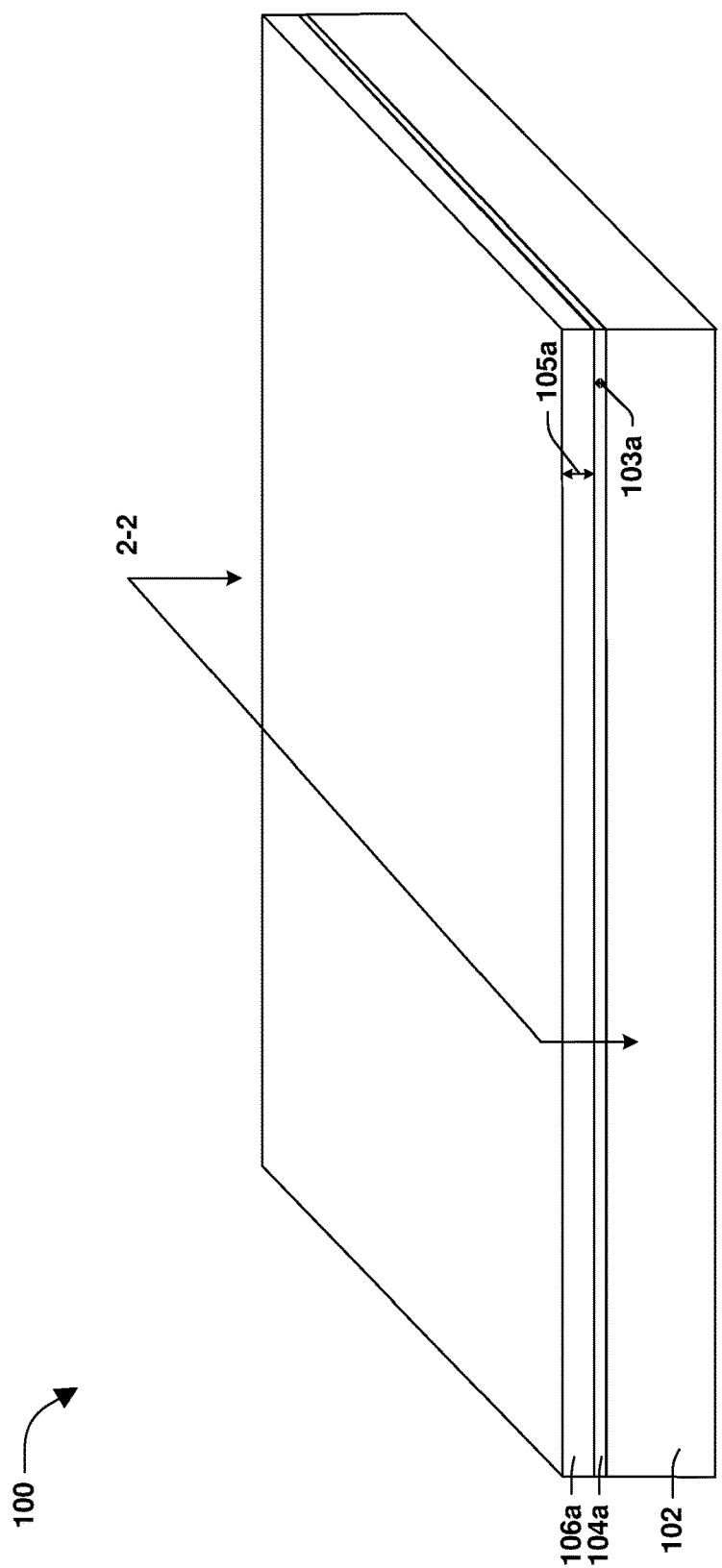
FIG. 1 is an illustration of a perspective view of a semiconductor device at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein. Some embodiments of the present disclosure have one or a combination of the following features and/or advantages.

According to some embodiments, a semiconductor device comprises a channel surrounding a dielectric tube. In some embodiments, the channel comprises silicon. In some embodiments, the dielectric tube comprises at least one of silicon or oxide and less than 1% germanium. In some embodiments, a gate surrounds the channel. In some embodiments, a ratio of a channel thickness of the channel divided by a channel length of the channel is between about 1/30 to about 10. In some embodiments, the channel thickness is between about 1 nm to about 30 nm. In some embodiments, the channel length is between about 3 nm to about 30 nm. In some embodiments, the dielectric tube has a tube width between about 3 nm to about 100 nm. In some embodiments, the channel thickness is independent of the tube width, such that a channel region comprising the channel can comprise any tube width without altering the channel thickness.

According to some embodiments, a method of forming the semiconductor device comprises forming a first tube material layer over a first channel material layer. In some embodiments, the first channel material layer is over a dielectric layer. In some embodiments, the first channel material layer is formed by forming a layer of silicon over the dielectric layer. In some embodiments, the first tube material layer is formed by growing a layer of at least one of silicon or germanium over the first channel material layer. In some embodiments, a first column is formed from the first tube material layer to form a first tube material and from the first channel material layer to form a first channel material. In some embodiments, the first tube material is over the first channel material. In some embodiments, a second channel material is formed over the first tube material such that the second channel material is in contact with the first channel material. In some embodiments, the second channel material is formed by performing at least one of chemical vapor deposition (CVD), atomic layer deposition (ALD), physical vapor deposition (PVD), etc. In some embodiments, the second channel material comprises silicon. In some embodiments, at least some of the dielectric layer is removed from under the first channel material to form a first gate opening. In some embodiments, the gate is formed in the first gate opening under the first channel material and around the second channel material. In some embodiments, an annealing operation is performed to form the dielectric tube from the first tube material and to form the channel from the first channel material and the second channel material.

According to some embodiments, the annealing operation comprises oxidizing the first tube material to form the dielectric tube. In some embodiments, few to no carriers, such as electrons or holes, are in or traverse the dielectric tube, such that the presence of the dielectric tube substantially limits or confines electrons or electron holes to the channel, where the channel is in close proximity to the gate, as compared to a semiconductor device that does not comprise a dielectric tube and thus does not limit carriers to an area in close proximity to the gate. In some embodiments, promoting location of carriers to an area in close proximity to the gate allows the gate to have greater control over carriers, which in turn allows the channel to be made shorter while inhibiting short channel effects, such as current leakage between a first active area comprising at least one of a source or a drain and a second active area comprising at least one of a source or a drain, as compared to a semiconductor device where carriers are not confined to an area in close proximity to the gate.

Figure 2:
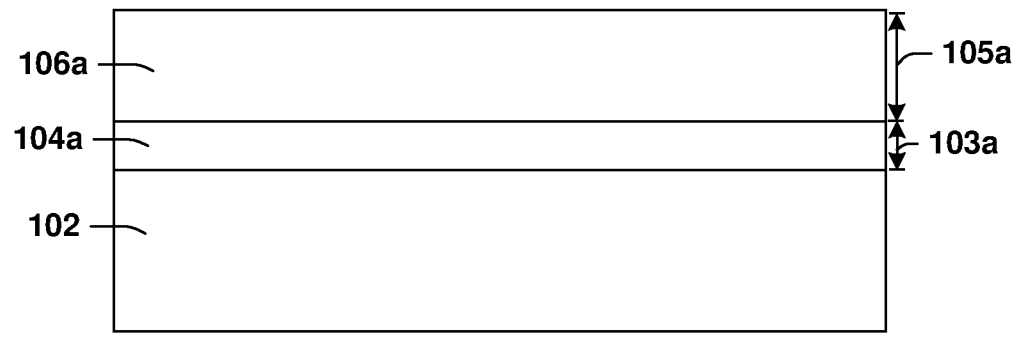
FIG. 2 is an illustration of a cross sectional view of a semiconductor device at a stage of fabrication, in accordance with some embodiments.

FIGS. 1, 3, 6, 9 and 12 are perspective views of a semiconductor device 100, FIGS. 4, 7, 10, 13 and 15 are top down views of the semiconductor device 100, and FIGS. 2, 5, 8, 11, 14 and 16 are cross-sectional views of the semiconductor device 100, according to some embodiments, at various stages of fabrication. Turning to FIGS. 1 and 2, where FIG. 2 illustrates a cross section of the semiconductor device 100 taken along line 2-2 in FIG. 1, according to some embodiments. In some embodiments, a first channel material layer 104a is formed over a dielectric layer 102, according to some embodiments. In some embodiments, the dielectric layer 102 comprises at least one of an oxide, a nitride, etc. In some embodiments, the dielectric layer 102 includes at least one of an epitaxial layer, a silicon-on-insulator (SOI) structure, a wafer, or a die formed from a wafer. In some embodiments, the dielectric layer 102 is over a substrate (not shown). In some embodiments, the substrate comprises at least one of silicon, germanium, carbon, etc. In some embodiments, the substrate includes at least one of an epitaxial layer, a silicon-on-insulator (SOI) structure, a wafer, or a die formed from a wafer. In some embodiments, the first channel material layer 104a comprises at least one of silicon, germanium, carbon, etc. In some embodiments, a first tube material layer 106a is formed over the first channel material layer 104a. In some embodiments, the first tube material layer 106a is grown, such as by epitaxial growth. In some embodiments, the first tube material layer 106a comprises at least one of silicon, germanium, etc. In some embodiments, the first channel material layer 104a and the first tube material layer 106a comprise different materials. In some embodiments, the first channel material layer 104a has a first channel material height 103a between about 1 nm to about 30 nm. In some embodiments, the first tube material layer 106a has a first tube material height 105a between about 3 nm to about 100 nm.

Figure 3:
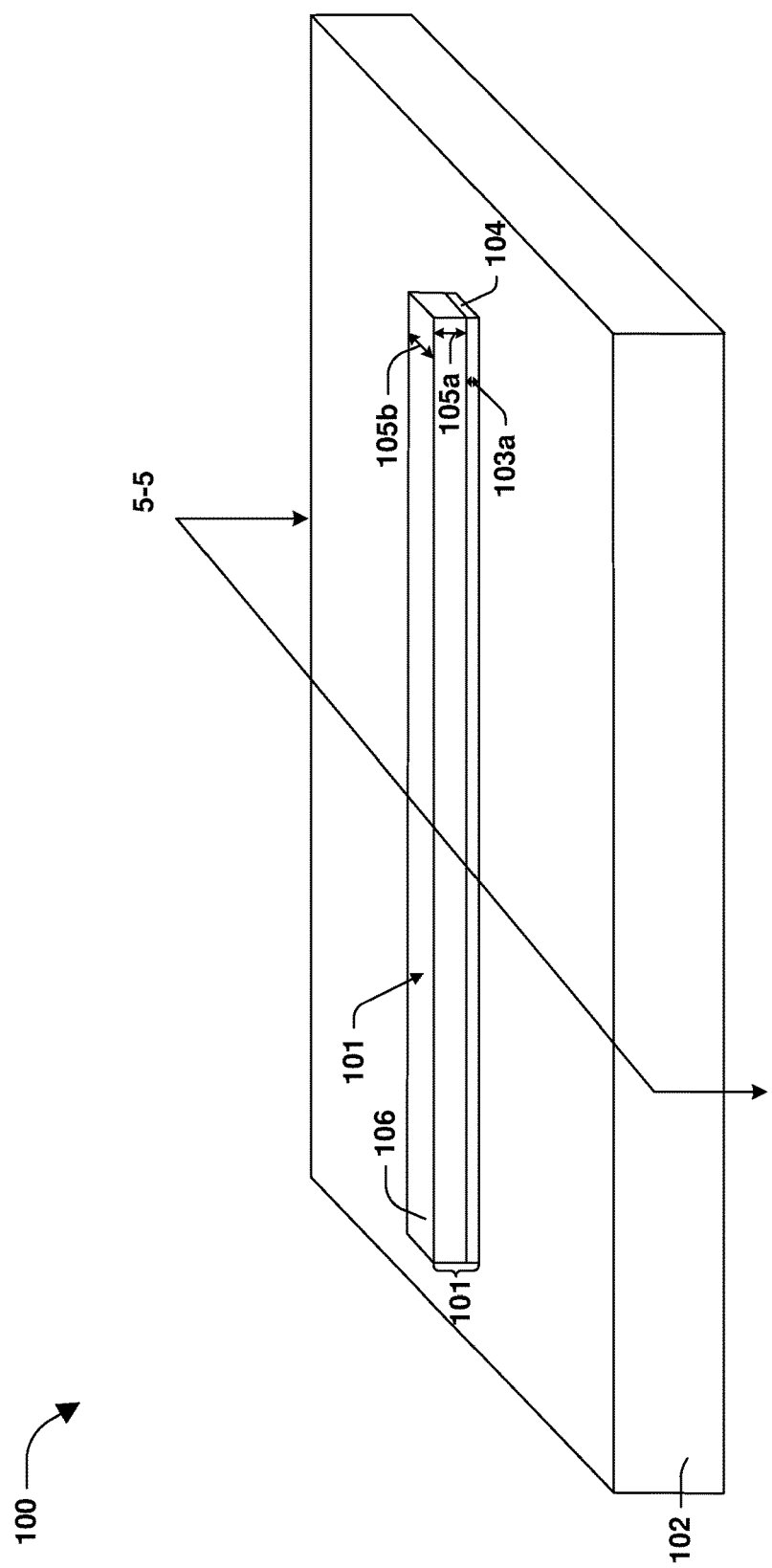
FIG. 3 is an illustration of a perspective view of a semiconductor device at a stage of fabrication, in accordance with some embodiments.
Figure 4:
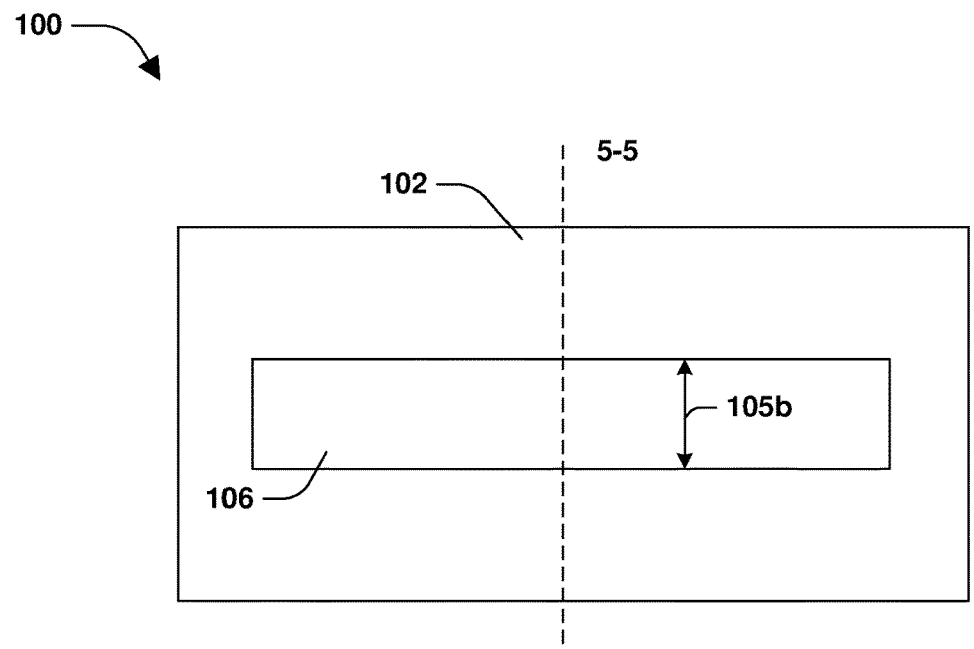
FIG. 4 is an illustration of a top down view of a semiconductor device at a stage of fabrication, in accordance with some embodiments.
Figure 5:
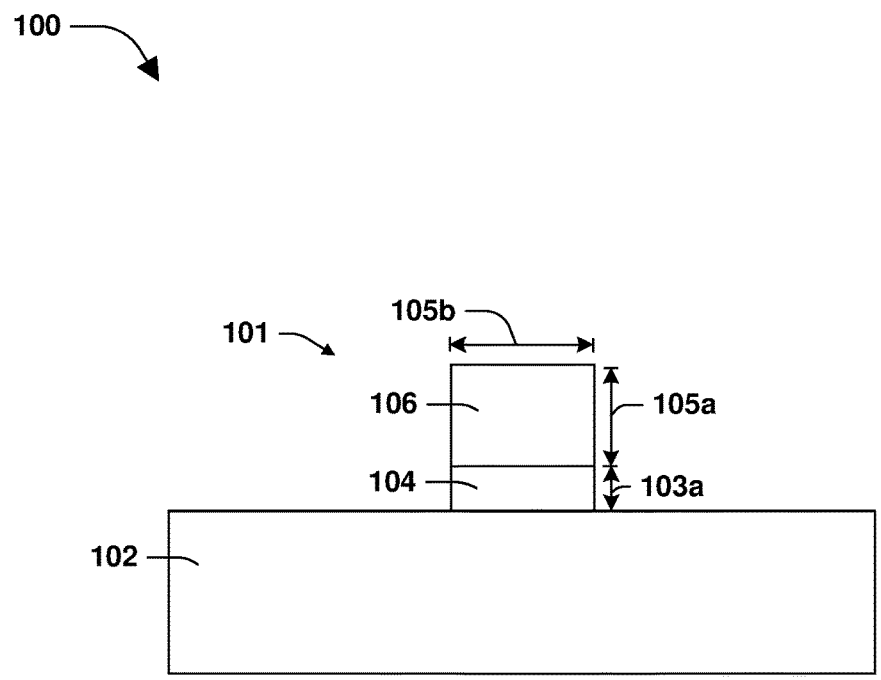
FIG. 5 is an illustration of a cross sectional view of a semiconductor device at a stage of fabrication, in accordance with some embodiments.

Turning to FIGS. 3, 4 and 5, where FIG. 5 illustrates a cross section of the semiconductor device 100 taken along line 5-5 in FIGS. 3 and 4, according to some embodiments. In some embodiments, the first channel material layer 104a is patterned to form a first channel material 104 and the first tube material layer 106a is patterned to form a first tube material 106. In some embodiments, the first channel material 104 and the first tube material 106 comprises a first column 101. In some embodiments, the first column 101 has a first column width 105b. In some embodiments, the first column width 105b is between about 3 nm to about 100 nm. In some embodiments, the first tube material 106 has the first tube material height 105a. In some embodiments, a width of the first tube material 106 is substantially equal to a width of the first channel material 104. In some embodiments, such as illustrated in FIG. 5, the first channel material 104 has the first channel material height 103a.

Figure 6:
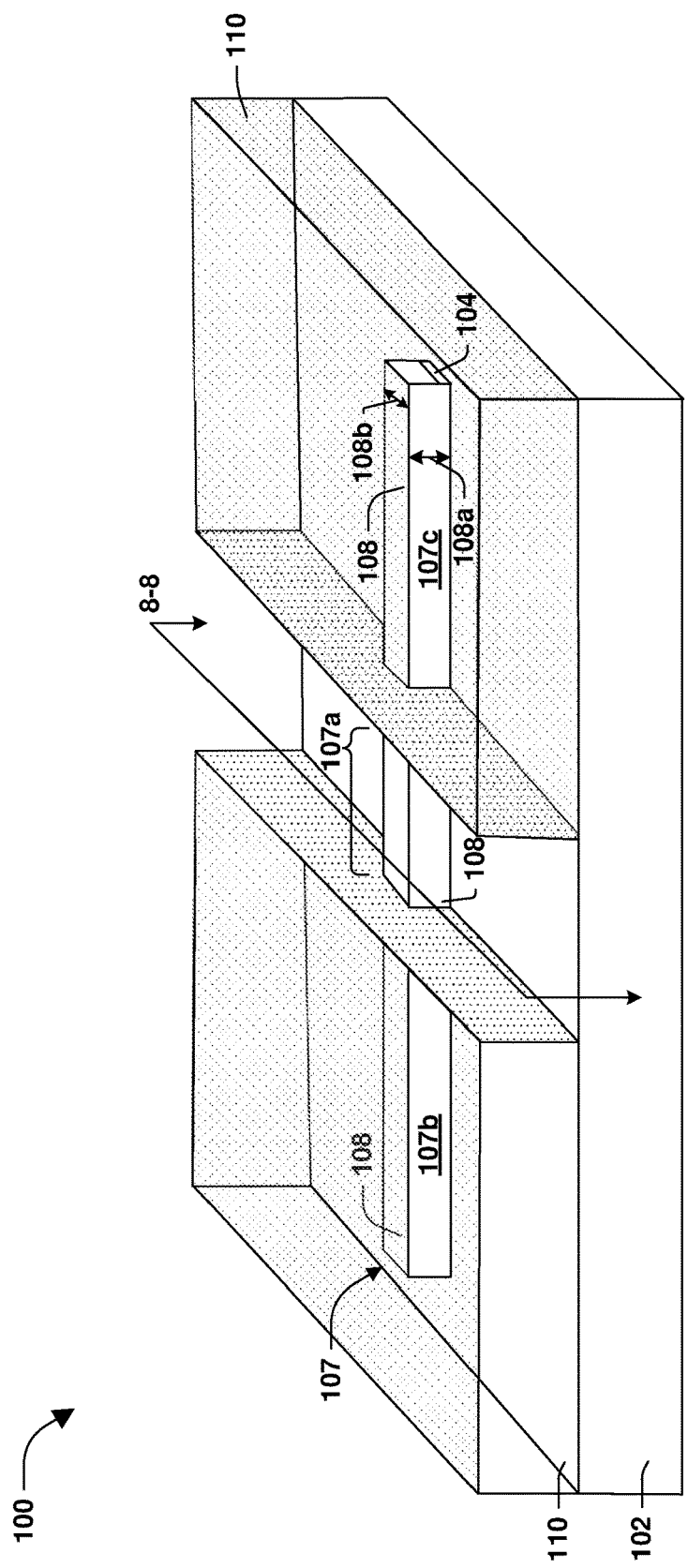
FIG. 6 is an illustration of a perspective view of a semiconductor device at a stage of fabrication, in accordance with some embodiments.
Figure 7:
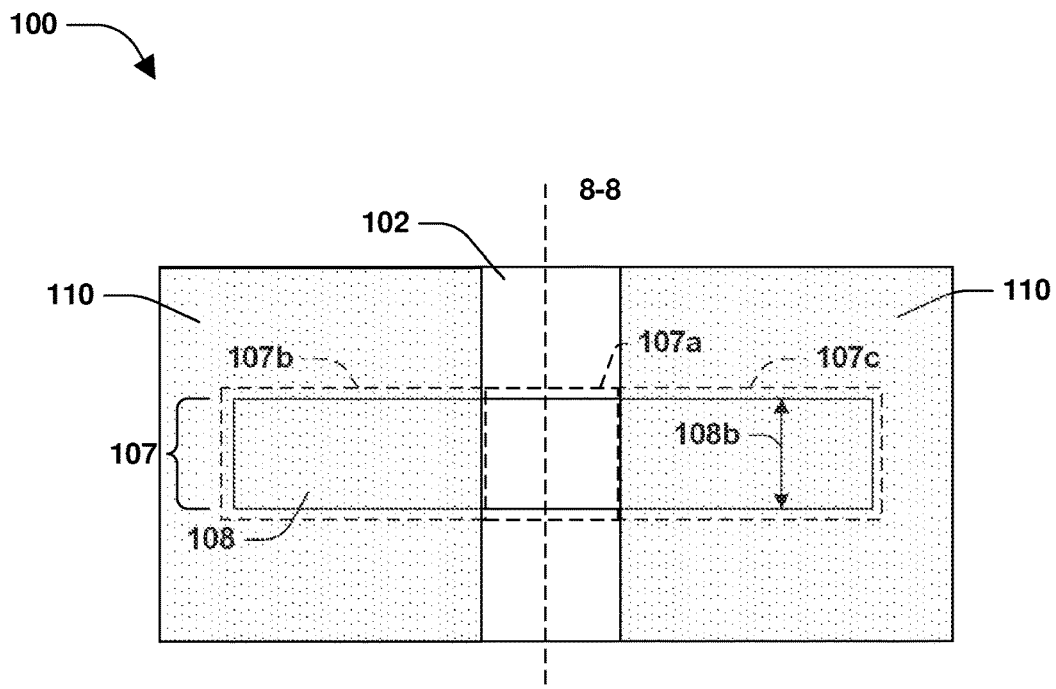
FIG. 7 is an illustration of a top down view of a semiconductor device at a stage of fabrication, in accordance with some embodiments.
Figure 8:
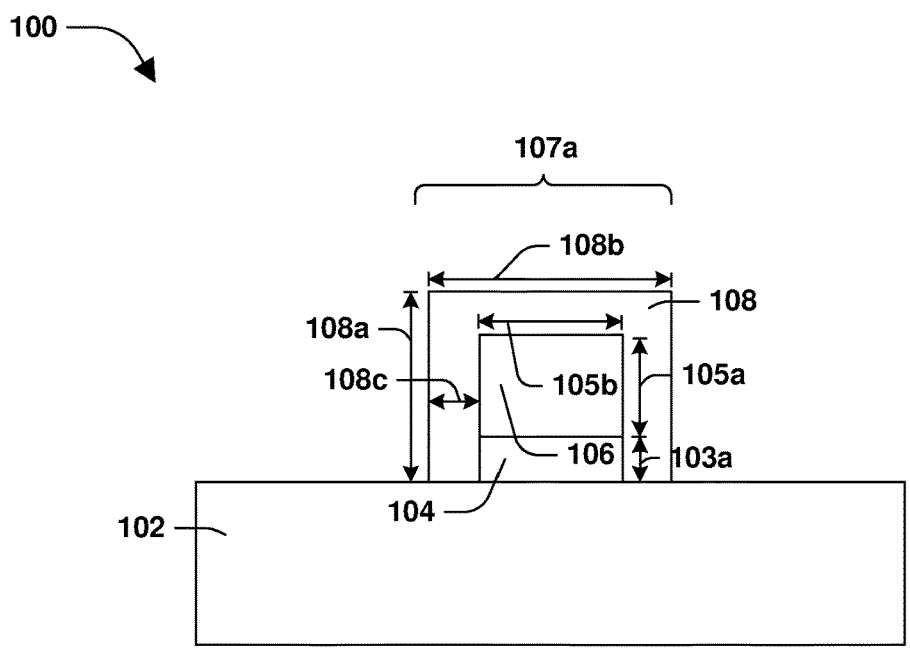
FIG. 8 is an illustration of a cross sectional view of a semiconductor device at a stage of fabrication, in accordance with some embodiments.

Turning to FIGS. 6, 7 and 8, where FIG. 8 illustrates a cross section of the semiconductor device 100 taken along line 8-8 in FIGS. 6 and 7, according to some embodiments. In some embodiments, a second channel material 108 is formed over the first column 101, such that a portion of the second channel material 108 is in contact with a portion of the first channel material 104. In some embodiments, the second channel material 108 is grown. In some embodiments, the second channel material 108 comprises at least one of silicon, germanium, carbon, etc. In some embodiments, the second channel material 108 comprises a same or similar material as the first channel material 104. In some embodiments, such as illustrated in FIG. 8, the second channel material 108 has a channel material thickness 108c between about 1 nm to about 30 nm.

According to some embodiments, such as illustrated in FIGS. 6 and 7, the first channel material 104, the first tube material 106, and the second channel material 108 comprise a semiconductor column 107. In some embodiments, the semiconductor column 107 comprises a first active area 107b coupled to a first end of a channel region 107a, the channel region 107a, and a second active area 107c coupled to a second end of the channel region 107a. In some embodiments, the first active area 107b comprises at least one of a source or a drain. In some embodiments, the first active area 107b comprises at least one of a first conductivity type or a second conductivity type. In some embodiments, the second active area 107c comprises at least one of a source or a drain. In some embodiments, the second active area 107c comprises at least one of a first conductivity type or a second conductivity type. In some embodiments, the first conductivity type comprises at least one of n-type or p-type. In some embodiments, the first conductivity type comprises n-type when the second conductivity type comprises p-type and the second conductivity type comprises n-type when the first conductivity type comprises p-type. In some embodiments, the semiconductor column 107 has a column height 108*a* between about 4 nm to about 130 nm. In some embodiments, the semiconductor column 107 has a column width 108*b* between about 4 nm to about 130 nm. In some embodiments, such as illustrated in FIGS. 6 and 7, a photoresist 110 is formed over at least one of the first active area 107*b* or the second active area 107*c*, such that the channel region 107*a* is exposed. In some embodiments, the first tube material 106 is removed from over the first channel material 104 in at least one of the first active area 107*b* or the second active area 107*c* prior to forming the second channel material 108. In some embodiments, the second channel material 108 is thus over or around merely the first channel material 104 in at least one of the first active area 107*b* or the second active area 107*c*, but is over or around both the first tube material 106 and the first channel material 104 in the channel region 107*a*.

Figure 9:
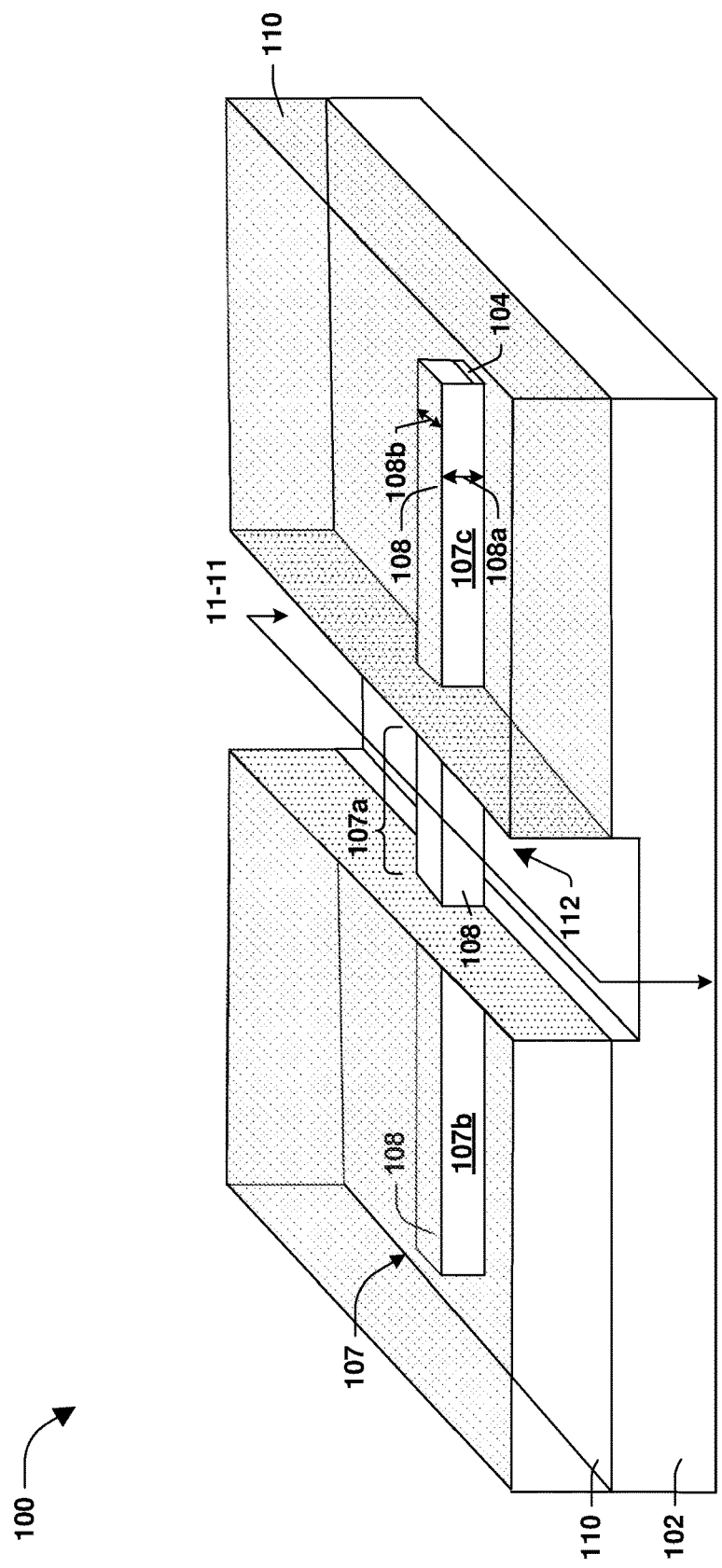
FIG. 9 is an illustration of a perspective view of a semiconductor device at a stage of fabrication, in accordance with some embodiments.
Figure 10:
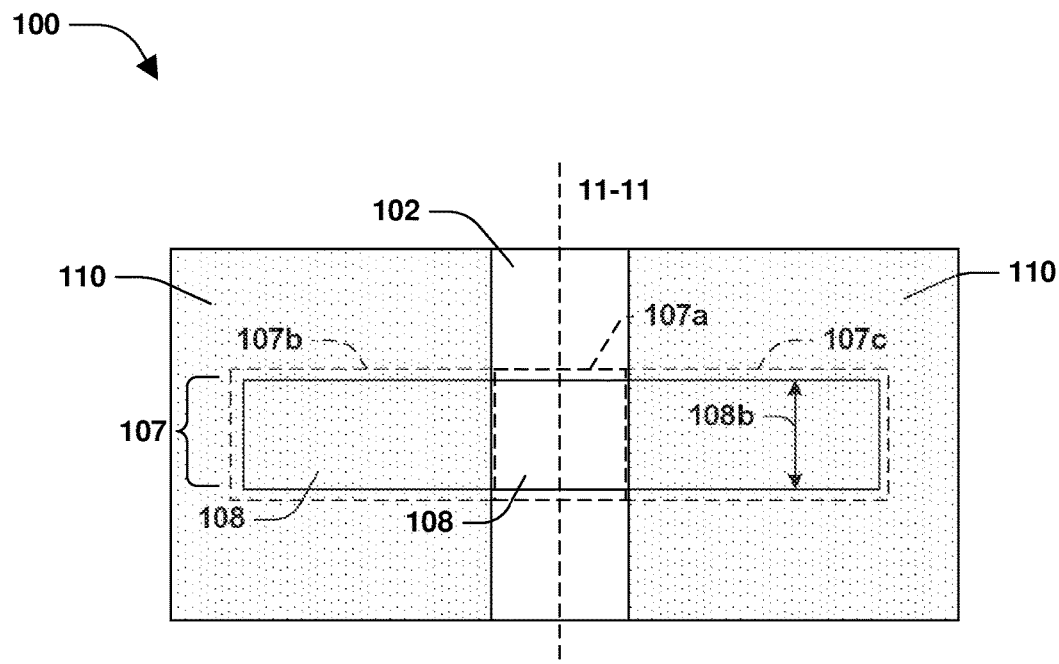
FIG. 10 is an illustration of a top down view of a semiconductor device at a stage of fabrication, in accordance with some embodiments.
Figure 11:
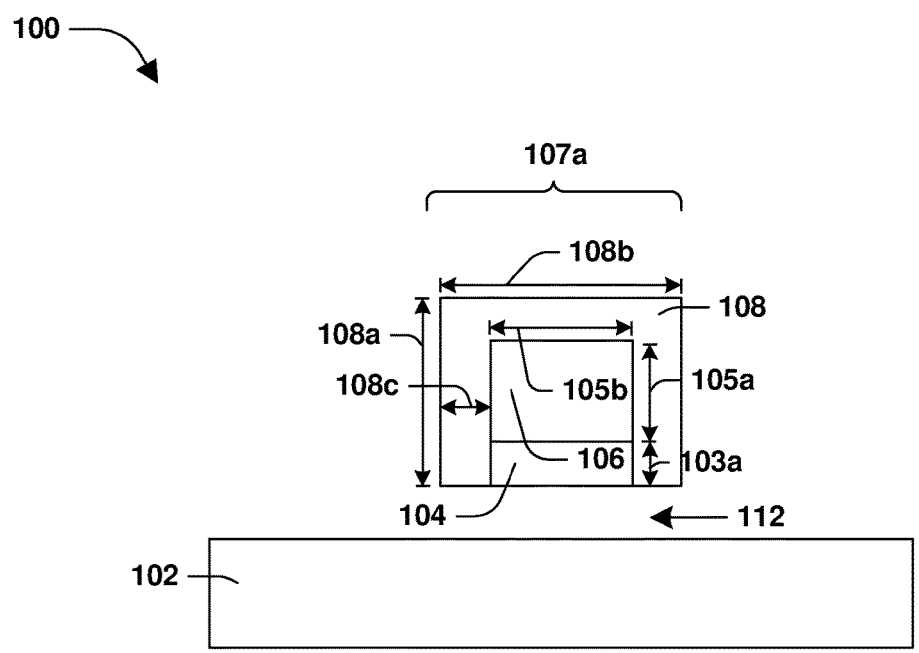
FIG. 11 is an illustration of a cross sectional view of a semiconductor device at a stage of fabrication, in accordance with some embodiments.

Turning to FIGS. 9, 10 and 11, where FIG. 11 illustrates a cross section of the semiconductor device 100 taken along line 11-11 in FIGS. 9 and 10, according to some embodiments. In some embodiments, at least some of the dielectric layer 102 is removed from under the first channel material 104 to form a first gate opening 112. In some embodiments, at least some of the dielectric layer 102 is removed by a selective etch, where the selective etch is selective for the dielectric layer 102. In some embodiments, the selective etch comprises a first etchant. In some embodiments, the first etchant is at least one of hydrogen, fluorine, nitrogen, etc. In some embodiments, the selective etch removes little to none of the first channel material 104 and little to none the second channel material 108. In some embodiments, the first gate opening 112 extends under at least some of the channel region 107*a* of the semiconductor column 107.

Figure 12:
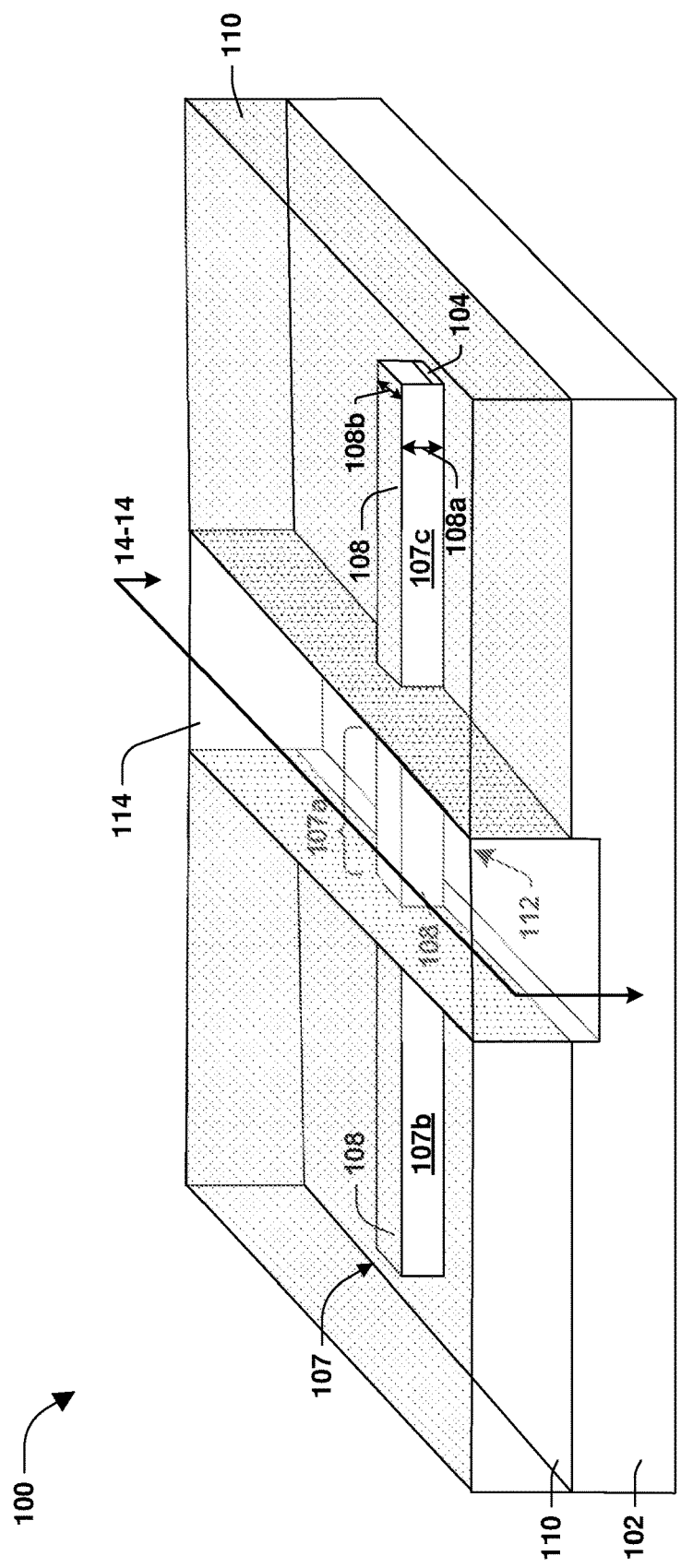
FIG. 12 is an illustration of a perspective view of a semiconductor device at a stage of fabrication, in accordance with some embodiments.
Figure 13:
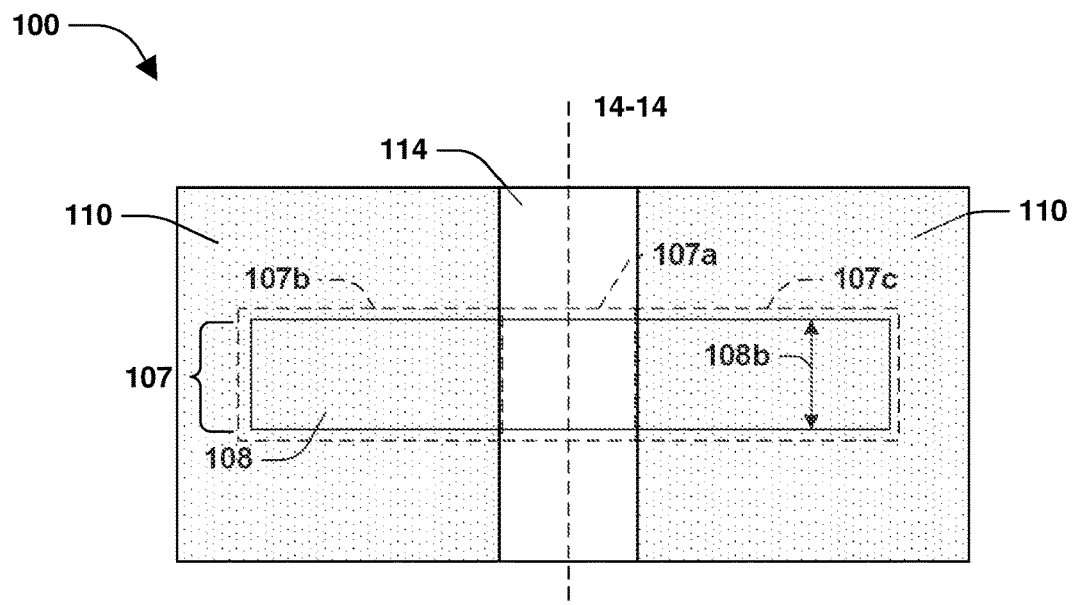
FIG. 13 is an illustration of a top down view of a semiconductor device at a stage of fabrication, in accordance with some embodiments.
Figure 14:
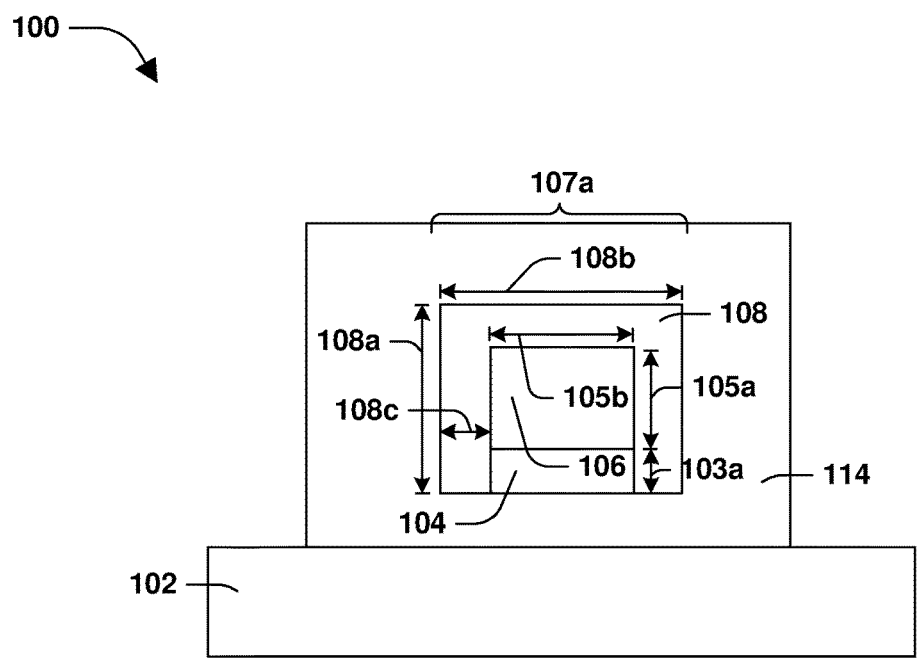
FIG. 14 is an illustration of a cross sectional view of a semiconductor device at a stage of fabrication, in accordance with some embodiments.

Turning to FIGS. 12, 13 and 14, where FIG. 14 illustrates a cross section of the semiconductor device 100 taken along line 14-14 in FIGS. 12 and 13, according to some embodiments. In some embodiments, a gate 114 is formed around at least some of the channel region 107*a* of the semiconductor column 107. In some embodiments, the gate 114 surrounds and is in contact with the first channel material 104 and the second channel material 108. In some embodiments, the gate 114 comprises a gate dielectric (not shown) surrounded by a gate electrode. In some embodiments, the gate dielectric is in contact with at least one of the first channel material 104 or the second channel material 108 in the channel region 107*a*. In some embodiments, the gate dielectric comprises a high dielectric constant material, such as oxide. In some embodiments, the gate electrode comprises a conductive material, such as metal. In some embodiments, the gate 114 is formed by deposition, such as at least one of CVD, ALD, PVD, etc.

Figure 15:
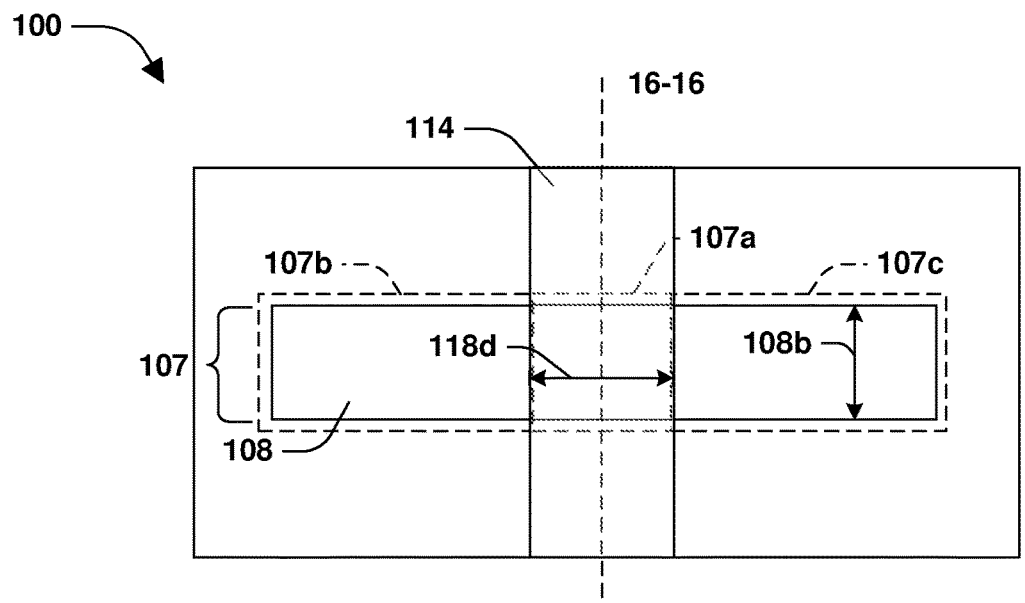
FIG. 15 is an illustration of a top down view of a semiconductor device at a stage of fabrication, in accordance with some embodiments.
Figure 16:
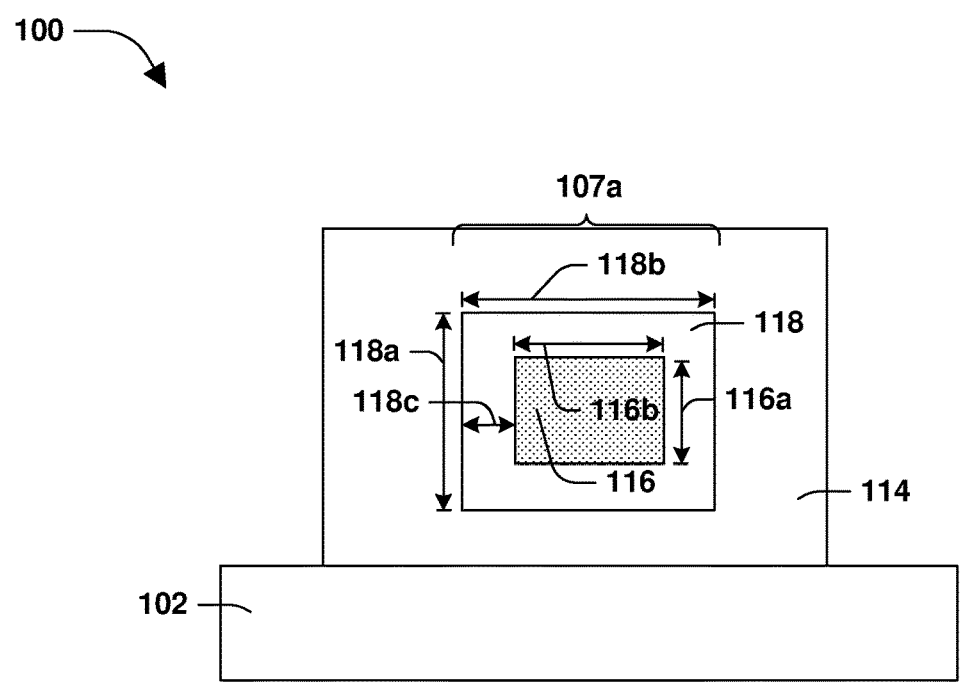
FIG. 16 is an illustration of a cross sectional view of a semiconductor device at a stage of fabrication, in accordance with some embodiments.

Turning to FIGS. 15 and 16, where FIG. 16 illustrates a cross section of the semiconductor device 100 taken along line 16-16 in FIG. 15, according to some embodiments. In some embodiments, an annealing operation is performed to form a dielectric tube 116 from the first tube material 106. In some embodiments, the photoresist 110 is removed prior to the annealing operation. In some embodiments, the photoresist 110 is removed after the annealing operation. In some embodiments, the annealing operation forms a channel 118 from at least one of the first channel material 104 or the second channel material 108. In some embodiment, the channel 118 has a channel thickness 118*c* between about 1 nm to about 30 nm. In some embodiment, the channel 118 has a channel height 118*a* between about 4 nm to about 130 nm. In some embodiment, the channel 118 has a channel width 118*b* between about 4 nm to about 130 nm. In some embodiment, the channel 118 has a channel length 118*d*. In some embodiments, the channel length 118*d* comprises a distance between the first active area 107*b* and the second active area 107*c*. In some embodiments, the channel length 118*d* is between about 3 nm to about 30 nm. In some embodiments, a ratio of the channel thickness 118*c* of the channel 118 divided by the channel length 118*d* of the channel 118 is between about 1/30 to about 10. In some embodiment, the dielectric tube 116 has a tube height 116*a* between about 3 nm to about 100 nm. In some embodiment, the dielectric tube 116 has a tube width 116*b* between about 3 nm to about 100 nm. In some embodiments, the dielectric tube 116 has a shape when viewed in FIG. 16. In some embodiments, the shape is at least one of square, oval, polygonal, triangular, etc.

According to some embodiments, the annealing operation oxidizes the first tube material 106, such that the dielectric tube 116 comprises at least one of silicon, oxide, etc., and less than 1% germanium. In some embodiments, the annealing operation comprises applying an oxide precursor at a flow rate between about 1 sccm to about 100 sccm. In some embodiments, the annealing operation occurs at a first temperature between about 600° C. to about 1,000° C. for a first annealing duration between about is to about 1 min. In some embodiments, the annealing operation occurs at a first pressure between about 1 torr to about 1,000 torr.

According to some embodiments, the presence of the dielectric tube 116 constrains the location of carriers, such as electrons or holes, to an area in closer proximity to the gate 114, as compared to a semiconductor device that does not have a channel surrounding a dielectric tube. In some embodiments, given the proximity of the gate 114 to the carriers, the gate is able to exert greater control over the carriers. In the some embodiments, the greater control afforded the gate allows the channel to have a shorter channel length while mitigating short channel effects, such as current leakage between the first active area 107*b* and the second active area 107*c*.

According to some embodiments, a semiconductor device comprises a channel surrounding a dielectric tube and a gate surrounding the channel. In some embodiments, a ratio of a channel thickness of the channel divided by a channel length of the channel is between about 1/30 to about 10.

According to some embodiments, a method of forming a semiconductor device comprises forming a first tube material over a first channel material. In some embodiments, the first channel material is over a dielectric layer. According to some embodiments, the method of forming a semiconductor device comprises forming a second channel material over the first tube material such that the second channel material is in contact with the first channel material and removing at least some of the dielectric layer from under the first channel material to form a first gate opening. According to some embodiments, the method of forming a semiconductor device comprises forming a gate in the first gate opening under the first channel material and around the second channel material and performing an annealing operation to form a dielectric tube from the first tube material and to form a channel from the first channel material and the second channel material.

According to some embodiments, a semiconductor device comprises a channel surrounding a dielectric tube. In some embodiments, the dielectric tube comprises at least one of silicon or oxide and less than 1% germanium. In some embodiments, a gate surrounds the channel.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    forming a first tube material over a first channel material, the first channel material over a dielectric layer;
    forming a second channel material over the first tube material such that the second channel material is in contact with the first channel material;
    removing at least some of the dielectric layer from under the first channel material to form a first gate opening;
    forming a gate in the first gate opening under the first channel material and around the second channel material; and
    performing an annealing operation to form a dielectric tube from the first tube material and to form a channel from the first channel material and the second channel material, wherein the channel surrounds the dielectric tube to enclose an outer perimeter of the dielectric tube.

2. The method of claim 1, wherein the forming a first tube material comprises growing a layer of at least one of silicon or germanium.

3. The method of claim 1, wherein the forming a second channel material comprises performing chemical vapor deposition to form a layer of silicon.

4. The method of claim 1, wherein the annealing operation oxidizes the first tube material.

5. The method of claim 1, wherein the removing comprises etching at least some of the dielectric layer to expose at least some of a bottom surface of the first channel material.

6. The method of claim 1, comprising forming a photoresist over a source region of the semiconductor device and a drain of the semiconductor device.

7. The method of claim 1, wherein the first channel material and the second channel material are silicon.

8. The method of claim 7, wherein the first tube material is silicon germanium.

9. The method of claim 8, wherein the annealing operation oxidizes the first tube material.

10. A method of forming a semiconductor device, comprising:
    forming a column over a dielectric layer;
    forming a material over a top surface and adjacent a sidewall of the column;
    removing at least some of the dielectric layer underlying the column to form a first gate opening;
    forming a gate in the first gate opening, adjacent a sidewall of the material, and over a top surface of the material; and
    performing an annealing operation to form a dielectric tube from a first portion of the column and to form a channel from a second portion of the column and a first portion of the material.

11. The method of claim 10, wherein the column comprises a first material layer and a second material layer over the first material layer.

12. The method of claim 11, wherein:
the annealing operation oxidizes the second material layer to form the dielectric tube, and
a first portion of the first material layer and the first portion of the material form the channel.

13. The method of claim 11, wherein the first material layer and the material comprise silicon.

14. The method of claim 11, wherein:
the column defines a source region, and
the method comprises removing the second material layer from the source region prior to the forming a material.

15. The method of claim 14, wherein:
the column further defines a channel region, and
the forming a material comprises forming the material over the first material layer in the source region and forming the material over the second material layer in the channel region.

16. The method of claim 10, wherein the removing comprises exposing a bottom surface of the column.

17. The method of claim 10, wherein the forming a gate comprises:
forming a gate dielectric; and
forming a gate electrode surrounding the gate dielectric.

18. The method of claim 10, wherein the channel surrounds the dielectric tube to enclose an outer perimeter of the dielectric tube.

19. A method of forming a semiconductor device, comprising:
forming silicon over a dielectric layer;
forming silicon germanium over the silicon;
forming additional silicon over the silicon germanium and adjacent a sidewall of the silicon germanium;
removing at least some of the dielectric layer to form a first gate opening under a first portion of the silicon;
forming a gate in the first gate opening; and
performing an annealing operation to oxidize the silicon germanium forming a dielectric tube, wherein the silicon and the additional silicon surround the dielectric tube.

20. The method of claim 19, wherein the silicon and the additional silicon enclose an outer perimeter of the dielectric tube.

* * * * *